United States Patent
Zaal et al.

(10) Patent No.: US 8,947,631 B2
(45) Date of Patent: *Feb. 3, 2015

(54) LITHOGRAPHIC APPARATUS AND DEVICE MANUFACTURING METHOD

(75) Inventors: Koen Jacobus Johannes Maria Zaal, Eindhoven (NL); Joost Jeroen Ottens, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 811 days.

This patent is subject to a terminal disclaimer.

(21) Appl. No.: 13/116,423

(22) Filed: May 26, 2011

(65) Prior Publication Data

US 2011/0222035 A1    Sep. 15, 2011

Related U.S. Application Data

(63) Continuation of application No. 12/631,274, filed on Dec. 4, 2009, now Pat. No. 8,743,339, which is a continuation of application No. 11/321,461, filed on Dec. 30, 2005, now Pat. No. 7,649,611.

(51) Int. Cl.
  *G03B 27/42* (2006.01)
  *G03B 27/52* (2006.01)
  *G03F 7/20* (2006.01)
(52) U.S. Cl.
  CPC ........ *G03F 7/70341* (2013.01); *G03F 7/70725* (2013.01); *G03F 7/70775* (2013.01); *G03F 7/70783* (2013.01); *G03F 7/7085* (2013.01); *G03F 7/70858* (2013.01); *G03F 7/70875* (2013.01)
  USPC .............................................. 355/53; 355/30

(58) Field of Classification Search
  CPC ...................................................... G03F 7/70341
  USPC .................................. 355/30, 53, 72; 250/548
  See application file for complete search history.

(56) References Cited

U.S. PATENT DOCUMENTS

| | | |
|---|---|---|
| 3,573,975 A | 4/1971 | Dhaka et al. |
| 3,648,587 A | 3/1972 | Stevens |

(Continued)

FOREIGN PATENT DOCUMENTS

| | | |
|---|---|---|
| CN | 1501172 | 6/2004 |
| DE | 206 607 | 2/1984 |

(Continued)

OTHER PUBLICATIONS

European Office Action dated Jan. 7, 2011 in corresponding European Patent Application No. EP10180995.

(Continued)

*Primary Examiner* — Hung Henry Nguyen
(74) *Attorney, Agent, or Firm* — Pillsbury Winthrop Shaw Pittman LLP

(57) ABSTRACT

A lithographic apparatus with a cover plate formed separately from a substrate table and means for stabilizing a temperature of the substrate table by controlling the temperature of the cover plate is disclosed. A lithographic apparatus with thermal insulation provided between a cover plate and a substrate table so that the cover plate acts as a thermal shield for the substrate table is disclosed. A lithographic apparatus comprising means to determine a substrate table distortion and improve position control of a substrate by reference to the substrate table distortion is disclosed.

25 Claims, 10 Drawing Sheets

(56) References Cited

U.S. PATENT DOCUMENTS

| | | | |
|---|---|---|---|
| 3,903,413 A | 9/1975 | Manning |
| 4,346,164 A | 8/1982 | Tabarelli et al. |
| 4,358,198 A | 11/1982 | Moriyama et al. |
| 4,390,273 A | 6/1983 | Loebach et al. |
| 4,396,705 A | 8/1983 | Akeyama et al. |
| 4,465,368 A | 8/1984 | Matsuura et al. |
| 4,480,910 A | 11/1984 | Takanashi et al. |
| 4,496,239 A | 1/1985 | Isohata et al. |
| 4,509,852 A | 4/1985 | Tabarelli et al. |
| 4,540,277 A | 9/1985 | Mayer et al. |
| 4,853,880 A | 8/1989 | Akamatsu et al. |
| 4,887,904 A | 12/1989 | Nakazato et al. |
| 4,999,669 A | 3/1991 | Sakamoto et al. |
| 5,040,020 A | 8/1991 | Rauschenbach et al. |
| 5,121,256 A | 6/1992 | Corle et al. |
| 5,162,642 A | 11/1992 | Akamatsu et al. |
| 5,229,872 A | 7/1993 | Mumola |
| 5,231,291 A | 7/1993 | Amemiya et al. |
| 5,243,195 A | 9/1993 | Nishi |
| 5,258,823 A | 11/1993 | Akamatsu |
| 5,296,891 A | 3/1994 | Vogt et al. |
| 5,363,196 A | 11/1994 | Cameron |
| 5,413,167 A * | 5/1995 | Hara et al. .................. 165/86 |
| 5,517,344 A | 5/1996 | Hu et al. |
| 5,523,193 A | 6/1996 | Nelson |
| 5,528,118 A | 6/1996 | Lee |
| 5,610,683 A | 3/1997 | Takahashi |
| 5,623,853 A | 4/1997 | Novak et al. |
| 5,633,968 A | 5/1997 | Sheem |
| 5,654,553 A | 8/1997 | Kawakubo et al. |
| 5,668,672 A | 9/1997 | Oomura |
| 5,689,377 A | 11/1997 | Takahashi |
| 5,715,039 A | 2/1998 | Fukuda et al. |
| 5,825,043 A | 10/1998 | Suwa |
| 5,835,275 A | 11/1998 | Takahashi et al. |
| 5,864,386 A | 1/1999 | Nei |
| 5,874,820 A | 2/1999 | Lee |
| 5,900,354 A | 5/1999 | Batchelder |
| 5,969,441 A | 10/1999 | Loopstra et al. |
| 5,985,495 A | 11/1999 | Okumura et al. |
| 5,997,963 A | 12/1999 | Davison et al. |
| 6,031,946 A | 2/2000 | Bergmann et al. |
| 6,046,792 A | 4/2000 | Van Der Werf et al. |
| 6,078,380 A | 6/2000 | Taniguchi et al. |
| 6,137,561 A | 10/2000 | Imai |
| 6,191,429 B1 | 2/2001 | Suwa |
| 6,236,634 B1 | 5/2001 | Lee et al. |
| 6,333,775 B1 | 12/2001 | Haney et al. |
| 6,560,032 B2 | 5/2003 | Hatano |
| 6,600,547 B2 | 7/2003 | Watson et al. |
| 6,603,130 B1 | 8/2003 | Bisschops et al. |
| 6,603,530 B1 | 8/2003 | Kohno |
| 6,618,122 B2 | 9/2003 | Bisschops et al. |
| 6,633,365 B2 | 10/2003 | Suenaga |
| 6,650,399 B2 | 11/2003 | Baselmans et al. |
| 6,710,849 B2 | 3/2004 | Kwan et al. |
| 6,741,331 B2 | 5/2004 | Boonman et al. |
| 6,757,048 B2 | 6/2004 | Arakawa |
| 6,762,826 B2 | 7/2004 | Tsukamoto et al. |
| 6,784,432 B2 | 8/2004 | Wieczorek |
| 6,785,006 B2 | 8/2004 | Nishida |
| 6,788,477 B2 | 9/2004 | Lin |
| 6,801,301 B2 | 10/2004 | Miyajima et al. |
| 6,867,844 B2 | 3/2005 | Vogel et al. |
| 6,952,253 B2 | 10/2005 | Lof et al. |
| 6,954,256 B2 | 10/2005 | Flagello et al. |
| 6,954,258 B2 | 10/2005 | Emoto |
| 7,009,682 B2 | 3/2006 | Bleeker |
| 7,075,616 B2 | 7/2006 | Derksen et al. |
| 7,078,715 B2 | 7/2006 | Vink et al. |
| 7,081,943 B2 | 7/2006 | Lof et al. |
| 7,098,991 B2 | 8/2006 | Nagasaka et al. |
| 7,164,466 B2 | 1/2007 | Hazelton |
| 7,199,858 B2 | 4/2007 | Lof et al. |
| 7,213,963 B2 | 5/2007 | Lof et al. |
| 7,227,616 B2 | 6/2007 | Graeupner |
| 7,372,538 B2 | 5/2008 | Binnard |
| 7,486,380 B2 | 2/2009 | Hazelton et al. |
| 7,649,611 B2 | 1/2010 | Zaal et al. |
| 7,843,550 B2 | 11/2010 | Ishii et al. |
| 8,482,845 B2 | 7/2013 | Lof et al. |
| 8,743,339 B2 * | 6/2014 | Zaal et al. .................. 355/53 |
| 2002/0020821 A1 | 2/2002 | Van Santen et al. |
| 2002/0037461 A1 | 3/2002 | Van Der Werf et al. |
| 2002/0041377 A1 | 4/2002 | Hagiwara et al. |
| 2002/0057423 A1 | 5/2002 | Nogawa |
| 2002/0061469 A1 | 5/2002 | Tanaka |
| 2002/0079455 A1 | 6/2002 | Wieczorek |
| 2002/0081760 A1 | 6/2002 | Whatmore |
| 2002/0101574 A1 | 8/2002 | Tsuji |
| 2002/0118370 A1 | 8/2002 | Nishida |
| 2002/0137358 A1 | 9/2002 | Binnard et al. |
| 2002/0145717 A1 | 10/2002 | Baselmans et al. |
| 2002/0163629 A1 | 11/2002 | Switkes et al. |
| 2002/0163630 A1 | 11/2002 | Bisschops et al. |
| 2002/0167642 A1 | 11/2002 | Jones et al. |
| 2002/0167651 A1 | 11/2002 | Boonman et al. |
| 2002/0196421 A1 | 12/2002 | Tanaka et al. |
| 2003/0030916 A1 | 2/2003 | Suenaga |
| 2003/0095244 A1 | 5/2003 | Komatsu |
| 2003/0123040 A1 | 7/2003 | Almogy |
| 2003/0174408 A1 | 9/2003 | Rostalski et al. |
| 2004/0000627 A1 | 1/2004 | Schuster |
| 2004/0021844 A1 | 2/2004 | Suenaga |
| 2004/0040694 A1 | 3/2004 | Hazelton |
| 2004/0075895 A1 | 4/2004 | Lin |
| 2004/0108467 A1 | 6/2004 | Eurlings et al. |
| 2004/0109237 A1 | 6/2004 | Epple et al. |
| 2004/0114117 A1 | 6/2004 | Bleeker |
| 2004/0114124 A1 | 6/2004 | Hoeks et al. |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0135099 A1 | 7/2004 | Simon et al. |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0239954 A1 | 12/2004 | Bischoff |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048223 A1 | 3/2005 | Pawloski et al. |
| 2005/0052632 A1 | 3/2005 | Miyajima |

(56) References Cited

U.S. PATENT DOCUMENTS

| | | |
|---|---|---|
| 2005/0061995 A1 | 3/2005 | Vink et al. |
| 2005/0068639 A1 | 3/2005 | Pierrat et al. |
| 2005/0073670 A1 | 4/2005 | Carroll |
| 2005/0078287 A1 | 4/2005 | Sengers et al. |
| 2005/0084794 A1 | 4/2005 | Meagley et al. |
| 2005/0094116 A1 | 5/2005 | Flagello et al. |
| 2005/0094125 A1 | 5/2005 | Arai |
| 2005/0099635 A1 | 5/2005 | Kakuchi et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0122505 A1 | 6/2005 | Miyajima |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0140948 A1 | 6/2005 | Tokita |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146693 A1 | 7/2005 | Ohsaki |
| 2005/0146694 A1 | 7/2005 | Tokita |
| 2005/0146695 A1 | 7/2005 | Kawakami |
| 2005/0147920 A1 | 7/2005 | Lin et al. |
| 2005/0151942 A1 | 7/2005 | Kawashima |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0200815 A1 | 9/2005 | Akamatsu |
| 2005/0205108 A1 | 9/2005 | Chang et al. |
| 2005/0213061 A1 | 9/2005 | Hakey et al. |
| 2005/0213065 A1 | 9/2005 | Kitaoka |
| 2005/0213066 A1 | 9/2005 | Sumiyoshi |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219489 A1 | 10/2005 | Nei et al. |
| 2005/0219499 A1 | 10/2005 | Zaal et al. |
| 2005/0225734 A1 | 10/2005 | De Smit et al. |
| 2005/0225737 A1 | 10/2005 | Weissenrieder et al. |
| 2005/0231694 A1 | 10/2005 | Kolesnychenko et al. |
| 2005/0233081 A1 | 10/2005 | Tokita |
| 2005/0237501 A1 | 10/2005 | Furukawa et al. |
| 2005/0243292 A1 | 11/2005 | Baselmans et al. |
| 2005/0243328 A1 | 11/2005 | Wegmann et al. |
| 2005/0245005 A1 | 11/2005 | Benson |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0259234 A1 | 11/2005 | Hirukawa et al. |
| 2005/0264778 A1 | 12/2005 | Lof et al. |
| 2005/0270505 A1 | 12/2005 | Smith |
| 2006/0033893 A1 | 2/2006 | Nakano |
| 2006/0103832 A1 | 5/2006 | Hazelton et al. |
| 2006/0114445 A1 | 6/2006 | Ebihara |
| 2006/0170891 A1 | 8/2006 | Nishinaga et al. |
| 2006/0181690 A1 | 8/2006 | Nishinaga et al. |
| 2006/0209414 A1 | 9/2006 | Van Santen et al. |
| 2006/0261288 A1 | 11/2006 | Van Santen |
| 2006/0285100 A1 | 12/2006 | Hamatani et al. |
| 2007/0013888 A1 | 1/2007 | Flagello et al. |
| 2007/0076181 A1 | 4/2007 | Ishii et al. |
| 2007/0076182 A1 | 4/2007 | Hazelton et al. |
| 2007/0109522 A1 | 5/2007 | Ebihara et al. |
| 2007/0132970 A1 | 6/2007 | Lof et al. |
| 2007/0146665 A1 | 6/2007 | Ottens et al. |
| 2007/0268471 A1 | 11/2007 | Lof et al. |
| 2009/0279061 A1 | 11/2009 | Jacobs et al. |
| 2010/0203455 A1* | 8/2010 | Binnard ............... 430/319 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 0 605 103 | 7/1994 |
| EP | 0 834 773 | 4/1998 |
| EP | 1039511 | 9/2000 |
| EP | 1 182 511 | 2/2002 |
| EP | 1 420 299 A2 | 5/2004 |
| EP | 1 420 300 A2 | 5/2004 |
| EP | 1 477 856 | 11/2004 |
| EP | 1 494 267 | 1/2005 |
| EP | 1 571 696 | 9/2005 |
| EP | 1 571 701 | 9/2005 |
| EP | 1 628 329 | 2/2006 |
| EP | 1 628 330 | 2/2006 |
| EP | 1 713 115 | 10/2006 |
| EP | 1 736 831 | 12/2006 |
| EP | 1 788 617 A1 | 5/2007 |
| EP | 1 821 336 | 8/2007 |
| EP | 1 865 540 | 12/2007 |
| FR | 2474708 | 7/1981 |
| JP | 57-153433 | 9/1982 |
| JP | 58-202448 | 11/1983 |
| JP | 59-19912 | 2/1984 |
| JP | 62-065326 | 3/1987 |
| JP | 62-121417 | 6/1987 |
| JP | 63-157419 | 6/1988 |
| JP | 2-47515 | 2/1990 |
| JP | 04-305915 | 10/1992 |
| JP | 04-305917 | 10/1992 |
| JP | 5-62877 | 3/1993 |
| JP | 05-251544 | 9/1993 |
| JP | 5-304072 | 11/1993 |
| JP | 06-084757 | 3/1994 |
| JP | 06-124873 | 5/1994 |
| JP | 06-168866 | 6/1994 |
| JP | 6-168866 | 6/1994 |
| JP | 07-132262 | 5/1995 |
| JP | 07-220990 | 8/1995 |
| JP | 08-316125 | 11/1996 |
| JP | 09-066429 | 3/1997 |
| JP | 09-184787 | 7/1997 |
| JP | 10-92728 | 4/1998 |
| JP | 10-135316 | 5/1998 |
| JP | 10-154659 | 6/1998 |
| JP | 10-160582 | 6/1998 |
| JP | 10-228661 | 8/1998 |
| JP | 10-255319 | 9/1998 |
| JP | 10-260009 | 9/1998 |
| JP | 10-303114 | 11/1998 |
| JP | 10-340846 | 12/1998 |
| JP | 11-126112 | 5/1999 |
| JP | 11-176727 | 7/1999 |
| JP | H11-239758 | 9/1999 |
| JP | 11-297615 | 10/1999 |
| JP | 2000-058436 | 2/2000 |
| JP | 2000-097616 | 4/2000 |
| JP | 2000-331931 | 11/2000 |
| JP | 2001-091849 | 4/2001 |
| JP | 2001-281050 | 10/2001 |
| JP | 2002-5737 | 1/2002 |
| JP | 2002-071513 | 3/2002 |
| JP | 2002-071514 | 3/2002 |
| JP | 2002-137358 | 5/2002 |
| JP | 2002-513856 | 5/2002 |
| JP | 2002-170754 | 6/2002 |
| JP | 2002-170765 | 6/2002 |
| JP | 2002-246309 | 8/2002 |
| JP | 2002-250678 | 9/2002 |
| JP | 2002-296005 | 10/2002 |
| JP | 2003-332213 | 11/2003 |

(56) References Cited

FOREIGN PATENT DOCUMENTS

| | | |
|---|---|---|
| JP | 2004-165666 | 6/2004 |
| JP | 2004-193252 | 7/2004 |
| JP | 2004-289126 | 10/2004 |
| JP | 2004-289127 | 10/2004 |
| JP | 2004-289128 | 10/2004 |
| JP | 2005-012201 | 1/2005 |
| JP | 2005-051231 | 2/2005 |
| JP | 2005-064514 | 3/2005 |
| JP | 2005-101136 | 4/2005 |
| JP | 2005-101488 | 4/2005 |
| JP | 2005-191557 | 7/2005 |
| JP | 2005-252247 | 9/2005 |
| JP | 2005-277363 | 10/2005 |
| JP | 2005-294838 | 10/2005 |
| JP | 2005-317600 | 11/2005 |
| WO | 98/33096 | 7/1998 |
| WO | 98/38597 A2 | 9/1998 |
| WO | 98/40791 | 9/1998 |
| WO | 99/39375 | 8/1999 |
| WO | WO 99/49504 | 9/1999 |
| WO | 99/60361 | 11/1999 |
| WO | 01/22480 | 3/2001 |
| WO | 02/090905 | 11/2002 |
| WO | 02/091078 | 11/2002 |
| WO | 03/077036 | 9/2003 |
| WO | 03/077037 | 9/2003 |
| WO | 03/085708 | 10/2003 |
| WO | 2004/019128 | 3/2004 |
| WO | 2004/053425 A1 | 6/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | 2004/057295 | 7/2004 |
| WO | WO 2004/055803 A1 | 7/2004 |
| WO | WO 2004/057589 A1 | 7/2004 |
| WO | WO 2004/057590 A1 | 7/2004 |
| WO | 2004/077154 | 9/2004 |
| WO | 2004/081666 | 9/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | 2004/105107 | 12/2004 |
| WO | 2004/112108 | 12/2004 |
| WO | 2005/001432 | 1/2005 |
| WO | 2005/001572 | 1/2005 |
| WO | 2005/003864 | 1/2005 |
| WO | 2005/006026 | 1/2005 |
| WO | 2005/008339 | 1/2005 |
| WO | 2005/013008 | 2/2005 |
| WO | 2005/015283 | 2/2005 |
| WO | 2005/017625 | 2/2005 |
| WO | WO 2005/010611 | 2/2005 |
| WO | 2005/019935 | 3/2005 |
| WO | 2005/022266 | 3/2005 |
| WO | 2005/022616 | 3/2005 |
| WO | 2005/024325 | 3/2005 |
| WO | WO 2005/024517 | 3/2005 |
| WO | 2005/034174 | 4/2005 |
| WO | 2005/050324 | 6/2005 |
| WO | 2005/054953 | 6/2005 |
| WO | 2005/054955 | 6/2005 |
| WO | 2005/059617 | 6/2005 |
| WO | 2005/059618 | 6/2005 |
| WO | 2005/059645 | 6/2005 |
| WO | 2005/059654 | 6/2005 |
| WO | 2005/062128 | 7/2005 |
| WO | 2005/064400 | 7/2005 |
| WO | 2005/064405 | 7/2005 |
| WO | 2005/069055 | 7/2005 |
| WO | 2005/069078 | 7/2005 |
| WO | 2005/069081 | 7/2005 |
| WO | 2005/071491 | 8/2005 |
| WO | 2005/074606 | 8/2005 |
| WO | 2005/076084 | 8/2005 |
| WO | 2005-076324 | 8/2005 |
| WO | 2005/081030 | 9/2005 |
| WO | 2005/081067 | 9/2005 |
| WO | 2005/098504 | 10/2005 |
| WO | 2005/098505 | 10/2005 |
| WO | 2005/098506 | 10/2005 |
| WO | 2005/106589 | 11/2005 |
| WO | 2005/111689 | 11/2005 |
| WO | 2005/111722 | 11/2005 |
| WO | 2005/119368 | 12/2005 |
| WO | 2005/119369 | 12/2005 |
| WO | 2005/122219 A1 | 12/2005 |
| WO | 2007/049603 A1 | 5/2007 |

OTHER PUBLICATIONS

U.S. Office Action dated Sep. 17, 2013 in corresponding U.S. Appl. No. 12/631,274.

M. Switkes et al., "Immersion Lithography at 157 nm", MIT Lincoln Lab, Orlando 2001-1, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future FAB International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

(56) References Cited

OTHER PUBLICATIONS

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial $\lambda$/NA scaling equations for resolution, depth of focus, and immersion lithography, *J. Microlith., Microfab., Microsyst.* 1(1):7-12 (2002).

European Search Report issued for EP Patent Application No. 06256380.4.-2222, dated Oct. 10, 2007.

European Search Report issued for EP Patent Application No. 06256380.4.-2222, dated Aug. 10, 2007.

Singapore Search Report for Application No. 200609068-2 dated Mar. 12, 2008.

Taiwan Office Action dated Mar. 30, 2011 in corresponding Taiwan Patent Application No. 095147653.

Japanese Office Action dated Dec. 27, 2011 in corresponding Japanese Patent Application No. 2009-287652.

U.S. Office Action dated Jun. 27, 2014 in corresponding U.S. Appl. No. 13/116,766.

\* cited by examiner

LITHOGRAPHIC APPARATUS AND DEVICE MANUFACTURING METHOD

The present application is a continuation of U.S. patent application Ser. No. 12/631,274 filed on Dec. 4, 2009, now U.S. Pat. No. 8,743,339, which is a continuation of U.S. patent application Ser. No. 11/321,461 filed on Dec. 30, 2005, now U.S. Pat. No. 7,649,611. The entire contents of each of the foregoing applications is herein fully incorporated by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another solution which has been proposed is to provide the liquid supply system with a barrier member which extends along at least a part of a boundary of the space between the final element of the projection system and the substrate table. The barrier member is substantially stationary relative to the projection system in the XY plane though there may be some relative movement in the Z direction (in the direction of the optical axis). A seal is formed between the barrier member and the surface of the substrate. In an embodiment, the seal is a contactless seal such as a gas seal. Such a system with a gas seal is disclosed in U.S. patent application publication no. US 2004-0207824, hereby incorporated in its entirety by reference.

In European patent application publication no. EP 1420300 and United States patent application publication no. US 2004-0136494, each hereby incorporated in their entirety by reference the idea of a twin or dual stage immersion lithography apparatus is disclosed. Such an apparatus is provided with two tables for supporting the substrate. Leveling measurements are carried out with a table at a first position, without immersion liquid, and exposure is carried out with a table at a second position, where immersion liquid is present. Alternatively, the apparatus may have only one table movable between exposure and measurement positions.

The substrate W may be displaced in the XY plane by moving the substrate table WT on which it is supported. The relative position of the substrate table WT and, therefore, the substrate W may be determined by reference to one or more mirrors mounted on lateral sides of the substrate table WT. For example, one or more interferometers may be provided to measure a substantially perpendicular distance from points on the surface of these mirrors to corresponding points or axes in a reference frame. Distortion of the substrate table WT may cause these mirrors to deform, thus compromising the accuracy with which the substrate W is moved and/or positioned relative to the projection system PS, which may have a negative impact on the quality of a pattern to be formed on the substrate W.

SUMMARY

It is desirable, for example, to provide a system for improving the accuracy with which a substrate may be positioned relative to, for example, the projection system.

According to an aspect of the invention, there is provided a lithographic apparatus, comprising: a substrate table arranged to support a substrate; a projection system configured to project a modulated radiation beam onto a substrate; a liquid supply system configured to provide a liquid in a region between the projection system and a substrate during exposure; a cover plate, physically separate from the substrate table, positioned radially outside of the substrate during exposure, and configured to provide a surface facing the projection system that is substantially adjacent to and level with the substrate; and a substrate table temperature stabilization device configured to reduce a temperature deviation of a part of the substrate table from a corresponding target temperature by controlling a temperature of a part of the cover plate.

According to a further aspect of the invention, there is provided a device manufacturing method, comprising: projecting a modulated radiation beam, through a liquid, onto a substrate held on a substrate table; and reducing a temperature deviation of a part of the substrate table from a corresponding target temperature by controlling a temperature of a part of a cover plate, the cover plate physically separate from the substrate table, radially outside of the substrate during projection of the modulated radiation beam and having a surface that is substantially adjacent and level with the substrate.

According to a further aspect of the invention, there is provided a lithographic apparatus, comprising: a substrate table arranged to support a substrate; a projection system configured to project a modulated radiation beam onto a substrate; a liquid supply system configured to provide a liquid in a region between the projection system and a substrate during exposure; a cover plate, physically separate from the substrate table, positioned radially outside of the substrate during exposure, and configured to provide a surface facing the projection system that is substantially adjacent to and level with the substrate; and a thermal insulator arranged to reduce heat transfer between the cover plate and the substrate table in order to provide thermal shielding of the substrate table by the cover plate.

According to a further aspect of the invention, there is provided a device manufacturing method, comprising: projecting a modulated radiation beam, through a liquid, onto a substrate held on a substrate table; and thermally insulating the a cover plate so as to reduce heat transfer between the cover plate and the substrate table and thereby enable thermal shielding of the substrate table by the cover plate, the cover plate physically separate from the substrate table, radially outside of the substrate during projection of the modulated radiation beam and having a surface that is substantially adjacent and level with the substrate.

According to a further aspect of the invention, there is provided A lithographic apparatus, comprising: a substrate table arranged to support a substrate; a projection system configured to project a modulated radiation beam onto a substrate; a measuring system configured to determine a position of a portion of the substrate table; a substrate table distortion determining device arranged to provide data regarding a distortion of the substrate table; and a substrate position controller configured to control the position of the substrate relative to the projection system by reference to the position of a portion of the substrate table measured by the measuring system and data regarding a distortion of the substrate table provided by the substrate table distortion determining device.

According to a further aspect of the invention, there is provided a device manufacturing method, comprising: projecting a modulated radiation beam onto a substrate held by a substrate table; determining a position of a portion of the substrate table; and controlling the position of the substrate relative to a projection system used to project the modulated radiation beam by reference to the determined position of the portion of the substrate table and data regarding a distortion of the substrate table.

According to a further aspect of the invention, there is provided a method of mapping a surface profile of a substrate table reflector in a lithographic apparatus, comprising: providing a first substantially planar reflector mounted on a first lateral side of a substrate table configured to support a substrate, the first reflector having a normal parallel to a first axis; providing a second substantially planar reflector mounted on a second lateral side of the substrate table, the second reflector having a normal parallel to a second axis non-parallel with respect to the first axis; and moving the substrate table parallel to the first axis while measuring a perpendicular distance from a surface of the second reflector to a reference point in a reference frame.

According to a further aspect of the invention, there is provided a device manufacturing method, comprising: mapping a surface profile of a reflector of a substrate table by moving the substrate table parallel to a first axis while measuring, in a direction substantially parallel to a second axis, a distance from a surface of the reflector to a reference point, the second axis being substantially orthogonal to the first axis; projecting a modulated radiation beam onto a substrate; and moving the substrate relative to a projection system used to project the modulated radiation beam in order to expose different target regions of the substrate, the movement controlled by reference to a position of the substrate, the position being determined by reference to a measurement of the separation of the substrate table reflector from a reference point and the surface profile of the substrate table reflector.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
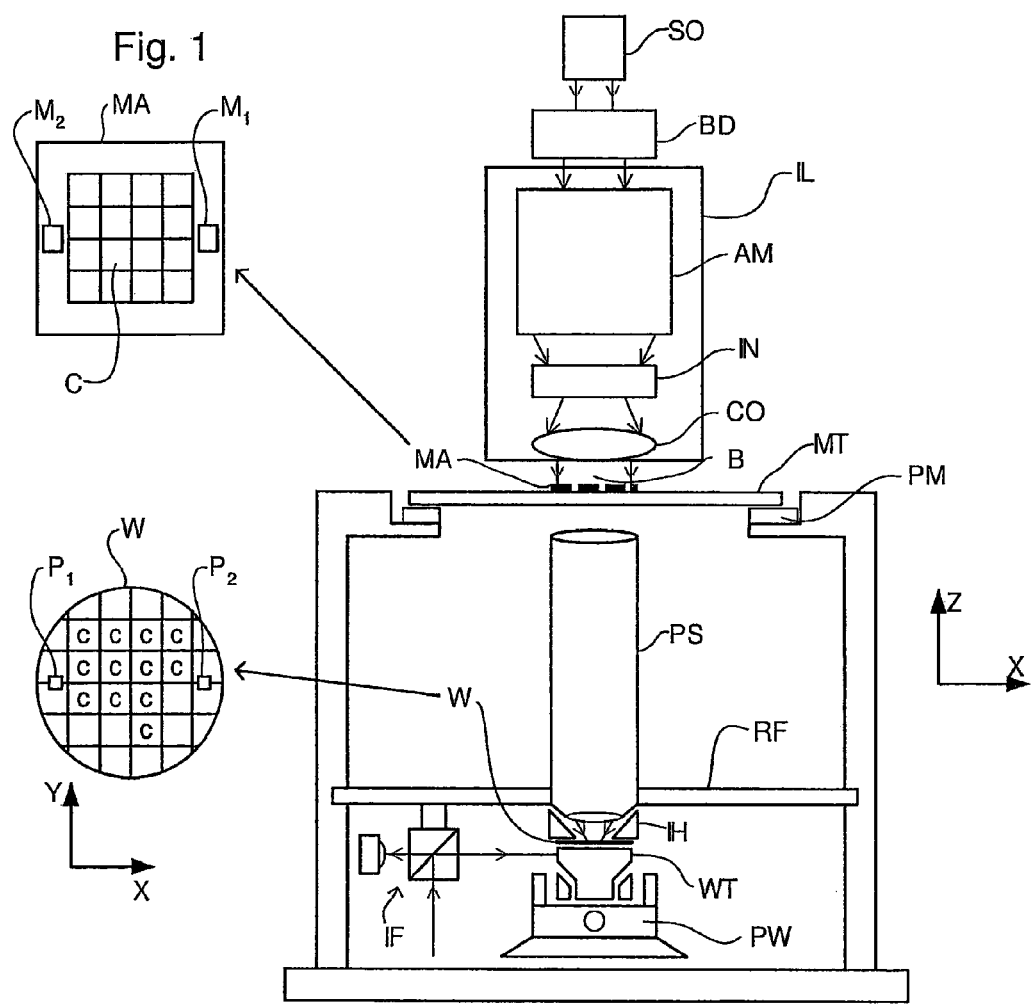
FIG. 1 depicts a lithographic apparatus according to an embodiment of the invention.
Figure 2:
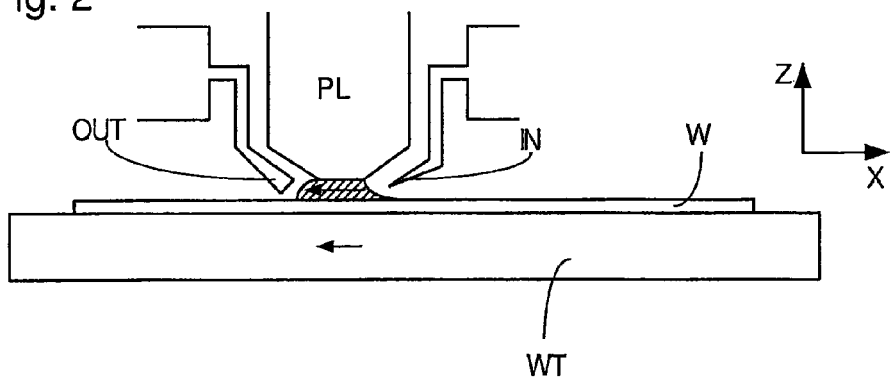
FIGS. 2 and 3 depict a liquid supply system for use in a lithographic projection apparatus.
Figure 3:
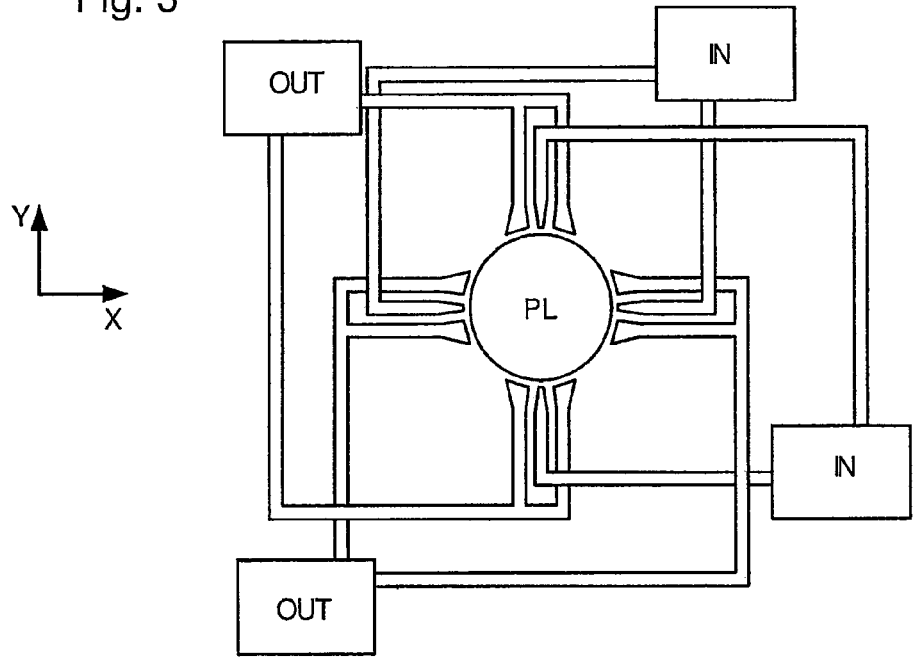
Figure 4:
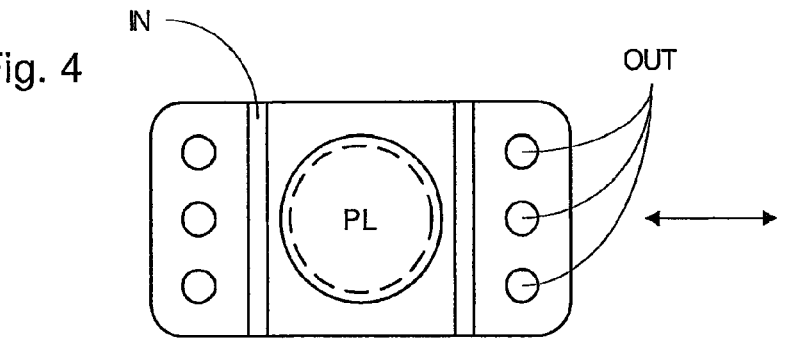
FIG. 4 depicts another liquid supply system for use in a lithographic projection apparatus.
Figure 4:
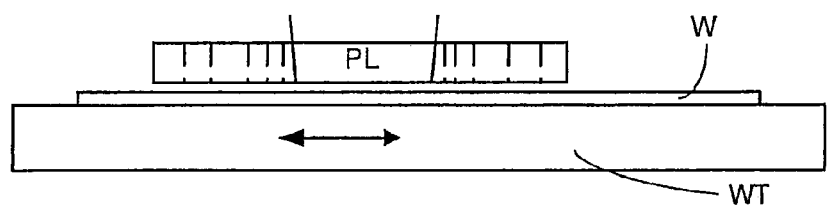

FIG. 1 schematically depicts a lithographic apparatus according to an embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 5:
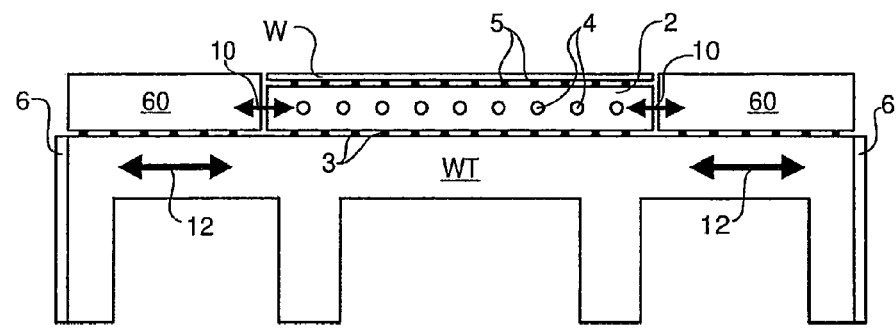
FIG. 5 depicts a substrate mounted on a substrate holder and movable substrate table.

FIG. 5 schematically shows a substrate W supported by a substrate holder 2 and substrate table WT. The substrate table WT can be moved relative to the projection system PS so as to expose different target regions of the substrate W. Accurate positioning of the substrate W is generally desirable. For example, where a device is to be formed from several lithographically produced layers, each layer should have a precise spatial correspondence with the other layers. The extent of this correspondence depends on how well the substrate W is positioned during patterning of each of the layers.

Accurate displacement can be achieved, for example, using a feedback or servo loop in combination with means for physically moving the substrate table WT and means for measuring its position. The substrate W is moved towards a target position by progressively reducing a difference between a measured position and the target position in the shortest possible time and, desirably, without overshoot.

Where the substrate W is fixed relative to, or has a known spatial relationship with, the substrate table WT, it may be more convenient to measure the position of one or more points on the substrate table WT and deduce therefrom the position of the substrate W than to try directly to measure the position of the much smaller and thinner substrate W.

The accuracy of such an approach depends at least partly on the precision with which the position of the substrate W may be deduced from measurements of the substrate table WT. In particular, this may become difficult where the substrate table WT becomes distorted during exposure, which may occur, for example, due to temperature variations of the substrate table WT and/or components that are in mechanical contact with the substrate table WT.

Temperature variations may arise due to heating from the lithography radiation, for example. Alternatively or additionally, particularly in immersion systems, evaporation of liquid (normally immersion liquid) from the surface of the substrate W and surrounding regions may lead to cooling. The situation may be further complicated by compensation systems that may be incorporated to control the temperature of the substrate W or other important elements. For example, a substrate heater may be supplied to counteract the cooling caused by evaporation of immersion liquid. Although the heater may be designed to maintain the substrate W at a more constant temperature, it may lead to a greater temperature gradient and/or variation in other components, such as the substrate table WT.

FIG. 5 shows an arrangement in which the substrate position may be measured indirectly via measurements of the substrate table WT. In the example shown, the substrate W is supported via protrusions or "burls" 5 on a substrate holder 2, itself configured to rest via burls 3 on the substrate table WT.

One or more cover plates 60 are provided to allow a liquid confinement structure 68 (see FIG. 11, for example—the liquid confinement structure 68 is not shown in FIGS. 5 and 8 to 10, for clarity), which at least partly confines an immersion liquid, to pass smoothly over the surface of the substrate W. In this configuration, the cover plate 60 is positioned radially outside of the substrate W in order to provide a sufficiently large planar surface for the liquid confinement structure 68 to operate as the substrate W is scanned relative to the projection system PS. The cover plate 60 may also be detachably mounted on burls 3 to provide flexibility for substrates of different sizes.

One or more mirrors 6 are mounted on lateral sides of the substrate table WT and it is by means of these mirrors that the position of the substrate table WT is determined. For example, one or more interferometers may be used, operating on the basis of radiation reflected from these mirrors. The interferometer can use the reflected radiation to deduce how far the surface of the mirror is from a particular point in a reference frame that is fixed with respect to the detecting part of the interferometer. In order to determine the position of the substrate table WT along different axes, a plurality of mirrors and corresponding interferometers may be provided. For example, two planar mirrors may be provided that face in orthogonal directions. The mirrors may be fixed to the substrate table WT or may be formed integrally with the substrate table WT.

Figure 6:
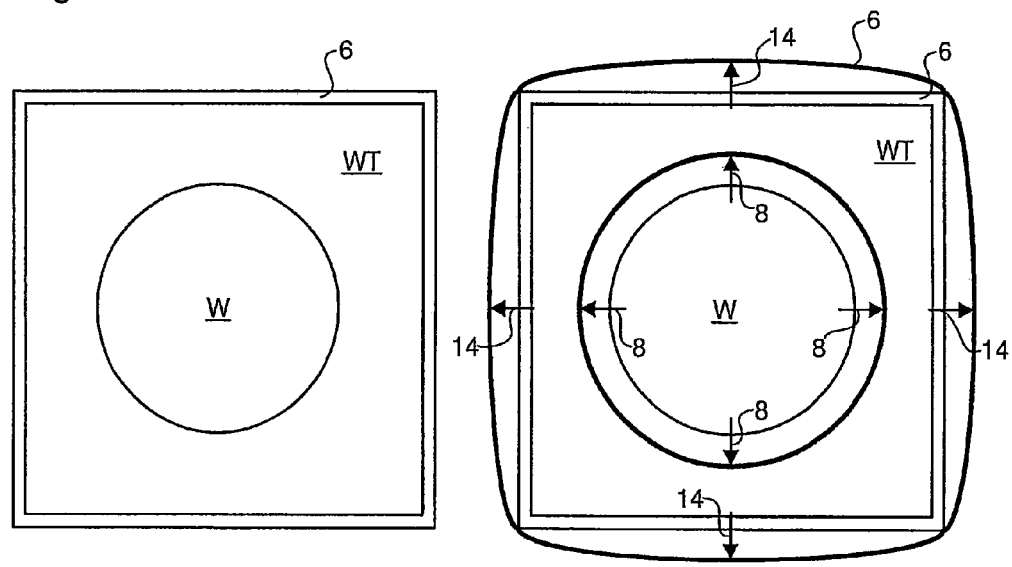
FIG. 6 depicts the effects on a substrate table caused by thermal expansion of a substrate holder.

Distortion of the substrate table WT can cause a distortion in the shape of the mirrors that are mounted on it. FIG. 6 schematically depicts a top view of the arrangement shown in FIG. 5 and illustrates one way in which such distortion may occur. In the left-hand figure, the center circle represents the substrate W with the substrate holder 2 (not visible) beneath it. The surrounding square is the substrate table WT with substantially perfectly planar mirrors 6 mounted on its lateral sides. The right-hand figure shows (in exaggerated form) the effects of thermally-induced distortion (arrows 10 in FIG. 5) of the substrate holder 2 on the substrate table WT. Heating of the substrate holder 2 has caused it to expand from its original form (thin line) to a thermally expanded form (thicker line; arrows 8 in FIG. 6). This heating may have been caused by a substrate heater 4 (which may be a plurality of channels used to conduct a heat-exchange fluid, for example), configured perhaps to counteract the cooling effect on the substrate W of immersion liquid evaporation. Alternatively or additionally, the heating may have arisen due to the lithography radiation itself.

The expanded substrate holder 2, which may be held quite firmly against the substrate table WT by, for example, a low pressure maintained between the two components, may exert radial forces that cause a distortion (arrows 12 in FIG. 5) in the body of the substrate table WT. This distortion, in turn, may cause a corresponding deformation of the mirrors 6 as shown in the right-hand diagram of FIG. 6 (thicker lines; arrows 14).

Either or both of the substrate table WT and substrate holder 2 may be formed from a material having a very small thermal expansion coefficient. However, such materials may be expensive and may not be available in a wide range of physical properties, which may make them less suitable in other respects. For example, wear resistance may be an important property for the substrate holder 2 but materials with good wear resistance and near-zero thermal expansion coefficient may not be available and/or economical.

Although the substrate table WT distortion in FIGS. 5 and 6 is shown as arising from the expansion of the substrate holder 2, distortion may also arise due to heating or cooling of the substrate table WT itself. For example, evaporation of immersion liquid is likely to cause some degree of thermal contraction. The substrate table WT may expand in some parts and contract in others leading to a distortion more complex than that shown in FIG. 6, which assumes a deformation based on a uniform expansion of the substrate holder 2.

The distortion of the mirrors 6 may cause an error in the control of the substrate W. For example, if corrective measures are not taken, when a portion of the mirror that is bulging outwards is positioned adjacent to the detecting interferometer, the interferometer may output a signal indicating that the substrate table WT as a whole is closer than it actually is, where in reality it is just a localized portion of the mirror that is closer. This may cause an erroneous offset in the position of the substrate W when this signal is input to the feedback loop.

Figure 7:
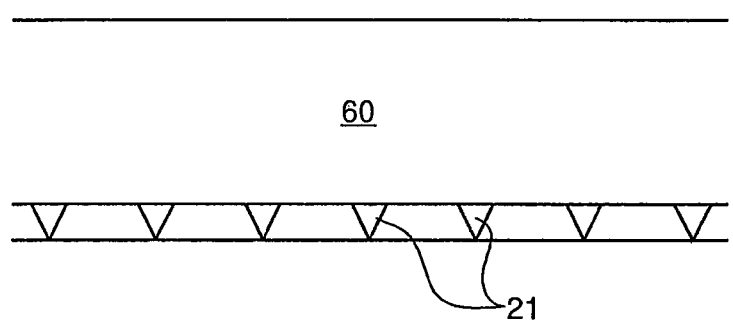
FIG. 7 depicts thermal insulation between a cover plate and the substrate table according to an embodiment of the invention.

FIG. 7 schematically shows an embodiment wherein the cover plate 60 is arranged so as to provide a thermal shield against possible sources of heating and/or cooling of the substrate table WT. This is achieved by providing thermal insulation between the cover plate 60 and the substrate table WT. In this way, change in temperature of the cover plate 60, caused for example by evaporation of immersion liquid or radiative heating, do not lead to a significant transfer of heat to the substrate table WT below the cover plate 60. In the example shown, the thermal insulation takes the form of special burls 21. The thermal conductance of these burls 21 is arranged to be low by minimizing their cross-sectional size and/or by using material of low thermal conductivity, for example. Radiative heat exchange between the substrate table WT and cover plate 60 may be reduced by applying reflective coatings on either or both of these components.

Figure 8:
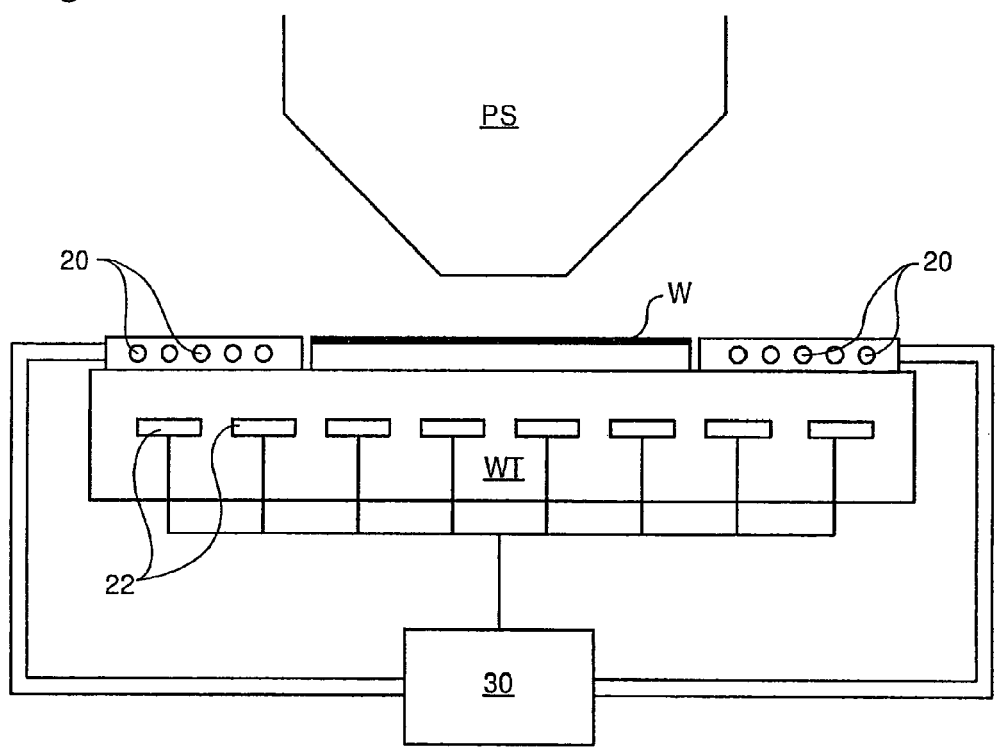
FIG. 8 depicts a substrate table temperature stabilization device according to an embodiment of the invention, with a network of channels.

FIG. 8 schematically shows part of a lithographic apparatus according to an embodiment of the invention, comprising a substrate table temperature stabilization device which is configured to maintain the temperature of a part of the substrate table WT and/or components in mechanical and/or thermal contact with the substrate table WT within a certain range (or ranges) of a target temperature. The range will depend on the accuracy desired and on the sensitivity of the substrate table WT (and the related components mentioned above) to change in temperature (e.g. its thermal expansion coefficient, mechanical structure, and/or any heat-sinking arrangements that are provided). Different ranges and/or target temperatures may be used for different parts of the substrate table WT according to an expected heat input or output. For example, a tighter tolerance might be desirable in a region of the substrate table WT that is more susceptible to thermal expansion or which is expected to be less exposed to heat input/output. Additionally or alternatively, a plurality of different target temperatures for different parts of the substrate table WT may be used where it is appropriate to maintain a controlled inhomogeneous temperature profile within the substrate table WT.

Stabilizing the temperature of the substrate table WT and/or related components may reduce the extent of thermal expansion and/or contraction thereof and thereby may reduce the overall distortion of the substrate table WT. This in turn may minimize disruption to the operation of substrate table WT position measuring device, such as mirrors 6 (not shown in FIG. 8) and thereby may improve the accuracy with which the substrate W may be positioned relative to the projection system PS, thus possibly reducing overlay errors for example.

The temperature stabilization device according to this embodiment operates by controlling the temperature of one or more cover plates 60. This may be done actively by controlling the temperature profile (including spatially constant or spatially varying temperature distribution) of the cover plate 60 according to a measured variation in the temperature profile or average temperature of the substrate table WT. Alternatively, the temperature stabilization device may operate more passively by merely controlling the temperature of the cover plate in isolation, without reference to measurement of the temperature profile of the substrate table WT (although the temperature of the cover plate may be measured). According to this latter approach, the temperature of the cover plate 60 may be controlled so as to maintain a substantially constant temperature (or, put another way, to maintain the temperature of the cover plate within a range of a target temperature for the cover plate 60). Controlling the temperature of the cover plate 60 without direct reference to the temperature of the substrate table WT may be implemented with a minimum of disruption to the substrate table apparatus.

Temperature control of the cover plate 60, passively and/or actively (see above), may effectively "shield" the substrate table WT from several of the most important sources of heat input and/or output. For example, a large proportion of evaporation of the immersion liquid, which causes cooling, may occur on the surface of the cover plate 60. Similarly, radiative heating from components exposed to the region above the substrate table WT will tend to impinge first on the cover plate 60. Controlling the temperature of the cover plate 60 directly to compensate for one or more of these factors may mean that their eventual effect on the temperature of the substrate table WT is reduced.

Where the cover plate temperature is controlled by reference to the measured temperature of the substrate table WT, the cover plate temperature control can also at least partially compensate for heating and/or cooling that reaches the substrate table WT without passing first through the cover plate 60 (for example, heating from substrate temperature compensation apparatus installed in the substrate holder 2 and/or from radiative heating from the radiation beam).

Temperature control of the cover plate 60 according to the arrangement of FIG. 8 is achieved by means of a network of channels 20 embedded within or on the cover plate 60 and a controller 30 arranged to control the temperature and/or pressure (and, therefore, flow rate) of a heat exchange fluid flowing within the network of channels 20 in order to maintain the temperature of a part of the substrate table WT (and/or related components such as substrate holder 2 and cover plate 60) within a range of a corresponding target temperature (each target temperature "corresponding" to one or more of the parts of the substrate table WT (and/or related components) that are being controlled). The heat exchange fluid may be purified water, for example. The temperature and/or pressure may be controlled, for example, by reference to calibration experiments, mathematical modelling of an expected power input/output to the substrate table WT, actual measurements of the temperature of the components contributing to the distortion (see below), and/or actual measurements of the fluid.

The system of channels 20 can be configured both to heat the cover plate 60 and to cool the cover plate 60, as required, thereby allowing flexible control of the substrate table temperature. Alternatively or additionally, the channels 20 can be configured to heat a part of the cover plate 60 while cooling another part. This may be achieved when a variation in temperature across the cover plate 60 and/or substrate table WT (and/or other related components) spans the temperature of the heat-exchange fluid. Alternatively, a system may be provided to supply heat-exchange fluid with one set of properties (e.g. high temperature) to one portion of the system of channels 20 while simultaneously providing heat-exchange fluid with a different set of properties (e.g. lower temperature) to another portion of the system of channels 20. In this way, the system of channels can be used to stabilize a wide range of temperature variations in the cover plate 60 and/or substrate table WT (and/or other related components).

Figure 9:
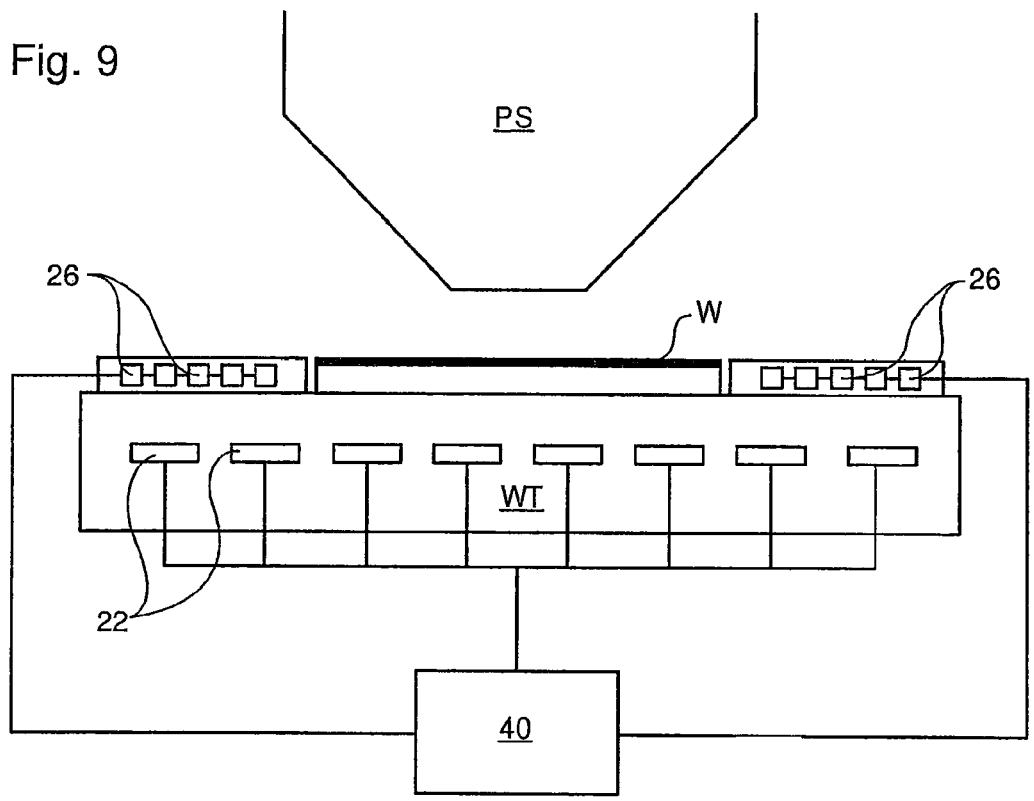
FIG. 9 depicts a substrate table temperature stabilization device according to an embodiment of the invention, with an electrical heater and a controller.

Alternatively and/or additionally, the substrate table temperature stabilization device may be provided with a one or more electrical heaters 26 and a controller 40 as schematically shown in FIG. 9. The one or more electrical heaters 26 may be embedded within the cover plate 60 as shown or may be attached to a surface of the cover plate 60 (above the cover plate, below it or on both sides).

An electrical heater can be controlled easily and with a minimum of additional hardware. Its output can be adjusted quickly, providing enhanced control and rapid response.

According to an embodiment, the heating elements 26 shown in FIG. 9 may comprise a material that undergoes a temperature-induced phase transition in the region of the target temperature, the phase transition causing the material to change from a state in which it produces a relatively high heating output below the transition temperature to a state in which it produces a relatively low heating output above the transition temperature. For example, a material that undergoes a magnetic-ordering transition may be chosen, such as a ferro-magnet, an anti-ferromagnet or a ferri-magnet. Alternatively or additionally, a material that undergoes a structural phase transition may be chosen.

The material may be chosen so that the resistivity of the material suddenly increases as the material is heated through the transition temperature. If the controller 40 is configured to maintain a constant voltage, the electrical power dissipated in the material will suddenly decrease due to the sudden increase in resistivity, which will tend to stabilize the temperature of the substrate table WT, even when the temperature varies strongly with position, without the need for complex control circuitry and a large number of temperature sensors and heaters. Where the temperature is too low (i.e. below the transition temperature and target temperature), the heating output will automatically be relatively high and where the temperature is too high (i.e. above the transition temperature and target temperature), the heating output will automatically be lower.

Figure 10:
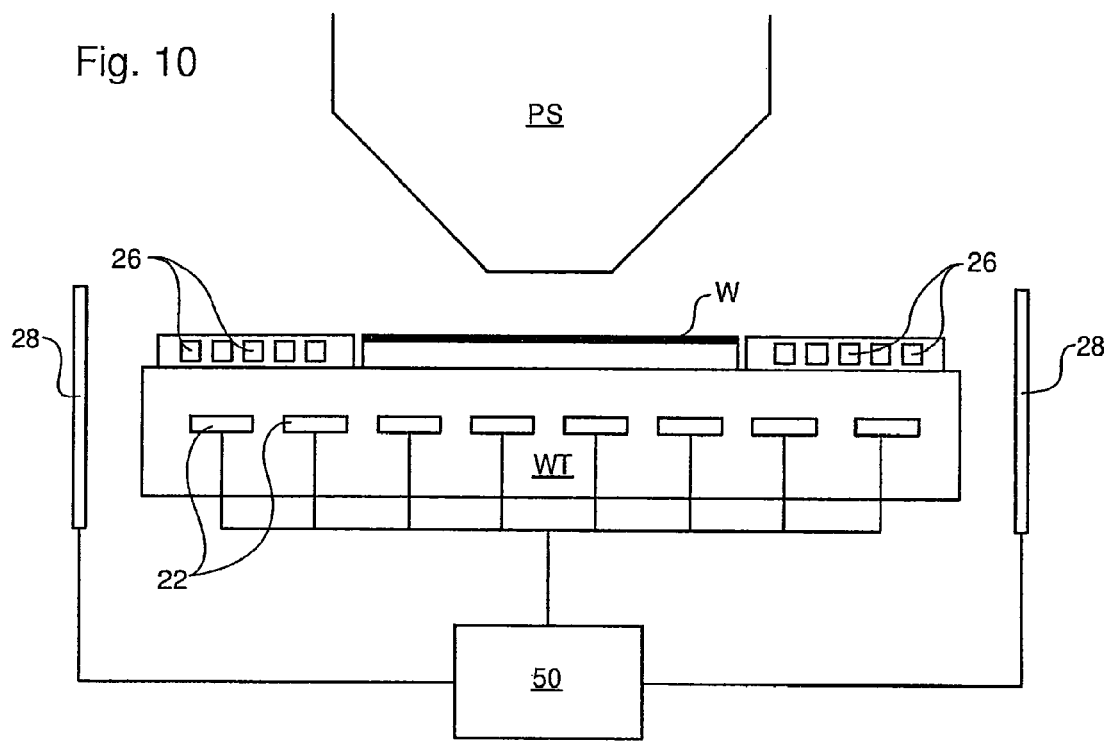
FIG. 10 depicts a substrate table temperature stabilization device according to an embodiment of the invention, with heating elements configured to be activated by a varying magnetic field.

An alternative or additional approach, which operates according to an analogous principle, is schematically shown in FIG. 10. Here, one or more heating elements 26 are provided that are actuated by one or more electromagnets 28 controlled by controller 50. The one or more heating elements 26 comprise a material that undergoes a phase transition that causes the material to change from a magnetically hysteretic state below the transition temperature to a non-magnetically-hysteretic state (i.e. a state which shows no, or a minimal amount of, magnetic hysteresis) above the transition temperature. The controller 50 and one or more electromagnets 28 are configured to apply a varying magnetic field to the one or more heating elements 26, which will cause the one or more heating elements to provide heat to the substrate table WT by magnetic hysteresis, only if the one or more heating elements are below the transition temperature. A ferromagnetic material may be used as the magnetically hysteretic material, for example. Again, this arrangement will tend to stabilize even position-varying temperature variations of the cover plate 60 and/or substrate table WT (and/or other related components) without the need for complex control circuitry and a large number of temperature sensors and heaters.

One or more temperature sensors 22 may be provided, fixed to the substrate table WT and/or cover plate 60, embedded within the substrate table WT and/or cover plate 60 (shown in FIGS. 8, 9 and 10), or positioned adjacent to the substrate table WT and/or cover plate 60 (for example, infrared sensors). One or more temperature sensors may also be provided in or on other components in thermal and/or mechanical contact with the substrate table WT. The one or more temperature sensors provide information about the temperature of the substrate table WT, cover plate 60 and/or related components, which can be used by the controllers 30, 40 and/or 50 to vary the heating/cooling output of the one or more heating/cooling elements 20/26 in order to keep the temperature of a part of the substrate table WT and/or cover plate 60 (and/or other related components) within a range of one or more corresponding target temperatures. For example, a feedback loop may be provided that adjusts the output of the one or more heating/cooling elements 20/26 in order to reduce a difference or differences between the reading(s) of the temperature sensor(s) and one or more target temperatures.

Figure 11:
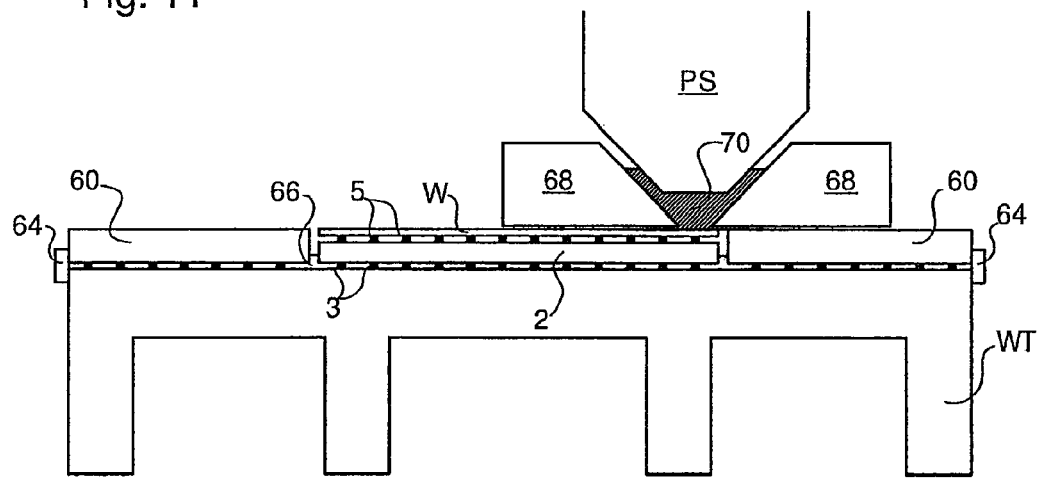
FIG. 11 depicts a substrate table assembly incorporating a thermally conducting coupling medium according to an embodiment of the invention.

FIG. 11 schematically shows an embodiment wherein the substrate W is supported on a substrate holder 2 positioned between the substrate W and the substrate table WT. This arrangement does not comprise any heating or cooling elements in the substrate holder 2. This means that the substrate holder 2 can be made less bulky and complex, which may reduce manufacturing expense. The smaller volume of material may also reduce problems caused when the substrate holder 2 expands or contracts, because these expansions or contractions will be proportionally smaller/weaker due to the smaller amount of material involved. Design constraints relating to thermal properties of the substrate holder 2 (e.g. the thermal expansion coefficient) may therefore be relaxed providing greater freedom to optimize other physical or economic properties of this component.

Enhanced thermal control of the substrate W, substrate holder 2, substrate table WT and/or cover plate 60 is achieved by providing a high thermal conductance pathway between the substrate W and the substrate holder 2, the substrate holder 2 and the substrate table WT, and/or the cover plate 60 and the substrate table WT. This may be achieved, according to an embodiment, by incorporating a thermally conducting coupling medium 66 between the substrate W, cover plate 60 and/or substrate table WT. In the example shown, this coupling medium is a liquid and is provided in a region beneath the substrate holder 2 and cover plate 60 and is contained by one or more plugs 64. The liquid provides a large contact surface between the substrate holder 2 and the substrate table WT without losing the flexibility associated with the use of burls as the main supporting mechanism. A liquid with a high thermal conductivity should be particularly effective.

Alternatively or additionally, a gaseous coupling medium may be used. For example, where the region between the substrate table WT and the cover plate 60 and/or substrate holder 2 is held under low pressure (i.e. at a pressure significantly below atmospheric pressure), the low pressure level may be reduced so as to achieve a balance between securing the substrate holder 2 (or cover plate 60) sufficiently firmly and providing some gas to improve thermal coupling of the substrate holder 2 (or cover plate 60) to the substrate table WT. Alternatively or additionally, regions of different gas pressure may be established beneath the substrate holder 2 and/or cover plate 60, a region of low pressure acting to secure the component(s) while a region of higher pressure acts to improve thermal coupling. Purified air may be used as the gas coupling medium, for example.

According to an alternative mechanism, a non-fluid coupling medium may be provided between the burls 3,5 and the substrate W, substrate holder 2, cover plate 60 and/or substrate table WT. For example, indium foil, which is very soft and a good conductor of heat, may be used.

The enhanced thermal pathway between the substrate W and/or substrate holder 2 and the substrate table WT and/or cover plate 60 may ensure that measures taken to stabilize the temperature of the substrate table WT also act to stabilize the temperature of the substrate W and substrate holder 2. This means that thermal expansion/contraction of the substrate holder 2, for example, may be less likely to cause distortion of the substrate table WT, which provides more scope for choosing a suitable material for the substrate holder 2. For example, a SiSiC substrate holder 2 may be used, which has high wear resistance.

Figure 12:
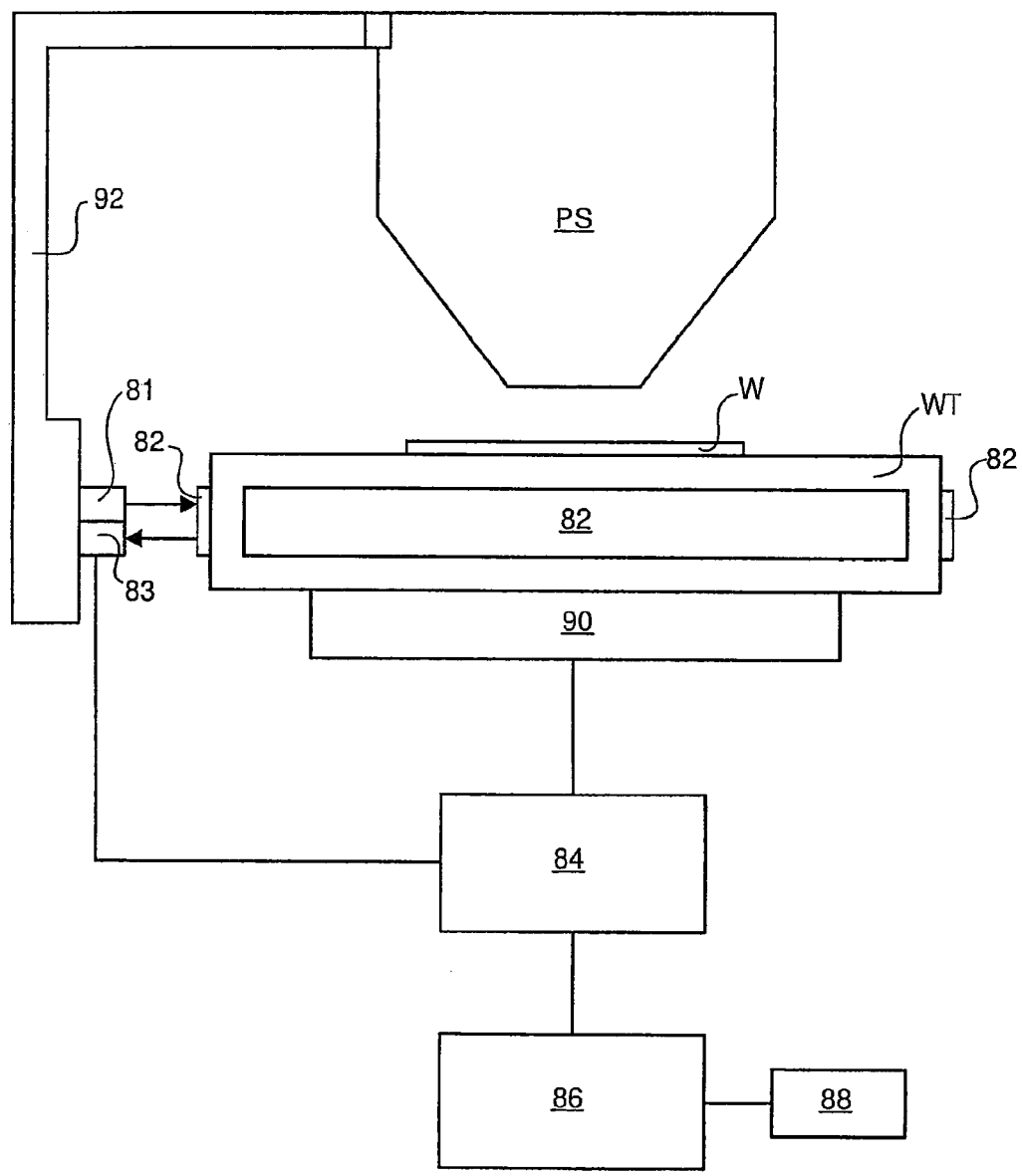
FIG. 12 depicts a position measuring system and a substrate table distortion measuring device according to an embodiment of the invention.

FIG. 12 schematically shows an embodiment comprising a measuring system to determine a position of a portion of the substrate table WT relative to a reference frame 92, which may, for example, be rigidly fixed with respect to the projection system PS and/or lithographic apparatus. The apparatus also comprises a substrate table distortion determining device 86 which is arranged to generate data regarding a distortion of the substrate table WT, for example from thermal contraction and/or expansion due to an unwanted temperature variation. The substrate W is displaced (for example scanned) relative to the projection system PS by means of a substrate table displacement device 90, which operates under the control of a substrate position controller 84.

The substrate position controller 84 determines how to move the substrate W along a desired trajectory by reference to data input from the measuring system and the substrate table distortion determining device 86. The measuring system provides regular updates on the position of a measured portion of the substrate table WT, from which the substrate position controller 84 is configured to derive a position of the substrate W. This operation is relatively straightforward if the substrate table WT maintains a constant geometry because there will be a correspondingly constant relationship between the position of the portion of the substrate table WT measured by the measuring system and the position of the substrate. However, this relationship may change if the geometry of the substrate table WT changes, which may lead to an error in the positioning of the substrate W. According to the present embodiment, this error may be reduced or avoided by using the output of the substrate table distortion determining device 86 to update the relationship between the position of the measured portion of the substrate table WT and the substrate position to reflect substrate table distortion. This approach may provide an improvement in substrate positioning and, therefore, overlay performance, for example, without the need for substantial additional hardware, such as that associated with trying to reduce a temperature irregularity in the substrate table WT and/or its direct physical consequence.

According to an embodiment, the measuring system comprises a plurality of planar reflectors 82 mounted on the lateral sides of the substrate table WT. One or more interferometers are provided to measure the position of the surfaces of the mirrors. The one or more interferometers may each comprise a radiation source 81 and a radiation detector 83 and a system for comparing the emitted radiation with the received radiation in order to determine a separation between the surface of the mirror onto which the radiation is incident at any one time and a fixed point relative to the reference frame 92 associated with the interferometer in question. By arranging the mirrors to be oriented in orthogonal directions, for example, it is possible to determine the position of a portion of the substrate table WT along orthogonal axes.

Distortion of the substrate table WT can cause these mirrors to become slightly curved. The substrate table distortion determining device 86 provides information about this curvature or "mirror profile" so that it can be corrected for.

One way in which this may be done is by measuring the curvature of the mirrors 82 and/or substrate table WT. This may be done as a calibration run to gauge how the substrate table WT deforms during one or a plurality of typical exposure sequence(s). The results of these calibration runs may be stored in a memory device 88, which may be accessed online by the distortion determining device 86 in order to provide the substrate table position controller with suitable corrections.

Figure 13:
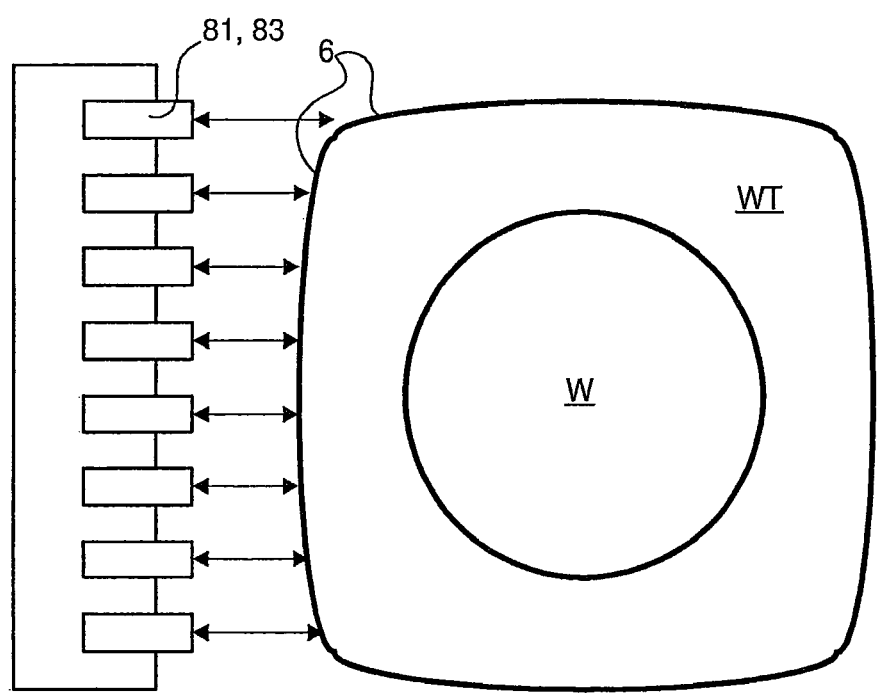
FIG. 13 depicts a measuring system comprising a plurality of interferometers per mirror according to an embodiment of the invention.

Alternatively or additionally, the measuring system may be provided with a plurality of interferometers (e.g. including pairs of radiation sources and detectors), as shown in FIG. 13, for each of the mirrors 82 formed in the substrate table WT. Each interferometer in this arrangement is capable of measuring the distance from a different portion of the surface of a mirror relative to the reference frame 92 at any one time and can thereby measure the profile of the substrate table WT very efficiently. This arrangement could be used quickly to derive calibration data about the expected distortion of the substrate table WT during exposure or could be used to provide online data to the substrate table distortion measuring device 86. Additionally or alternatively, the substrate table position controller 84 could be configured to take an average of the readings of each of the interferometers for each of the mirrors in order to obtain a more accurate measurement of the position of one lateral side of the substrate table WT than would be possible using only a single interferometer (in the case where the corresponding mirror is not exactly planar).

Alternatively or additionally, the substrate table distortion determining device 86 may be configured to determine an expected substrate table distortion by means of a predictive model. The model may be based on thermal and mechanical properties of the substrate W, substrate holder 2, substrate table WT and/or any component in thermal and/or mechanical contact with any one or more of these components, as well an expected power input or output from the lithography radiation and/or evaporation of an immersion liquid from the surface of the substrate W and/or cover plate 60, for example. Parameters of the model may be tuned by reference to calibration measurements. The expected power input or output may be derived from analysis of the energy flow associated with a particular desired dose pattern or may be derived from calibration measurements. Where distortion of the substrate table WT is expected to arise from a thermally expanded substrate holder 2 pressing against the substrate table WT, a simplified model based on uniform expansion of the substrate holder 2 may be effective.

The surface profile of a substrate table positioning mirror 82 may also be determined by a mapping method. For example, in the case where two nominally planar reflectors 82 are provided on different non-parallel lateral sides of the substrate table WT, and a single interferometer is provided for each of the mirrors, the surface profile of a first one of the mirrors 82 can be mapped by moving the substrate table WT parallel to a normal to a second one of the mirrors 82 while measuring how a perpendicular distance from the interferometer to the surface of the first mirror varies. The process could then be repeated, but moving the substrate table WT parallel to a normal to the first mirror 82 in order to map the profile of the second mirror.

In an embodiment, there is provided a lithographic apparatus, comprising: a substrate table arranged to support a substrate; a projection system configured to project a modulated radiation beam onto a substrate; a liquid supply system configured to provide a liquid in a region between the projection system and a substrate during exposure; a cover plate, physically separate from the substrate table, positioned radially outside of the substrate during exposure, and configured to provide a surface facing the projection system that is substantially adjacent to and level with the substrate; and a substrate table temperature stabilization device configured to reduce a temperature deviation of a part of the substrate table from a corresponding target temperature by controlling a temperature of a part of the cover plate.

In an embodiment, the temperature stabilization device comprises a heating element configured to input heat to a portion of the cover plate, a cooling element configured to extract heat from a portion of the cover plate, or both the heating element and the cooling element. In an embodiment, the temperature stabilization device comprises a network of channels embedded within the cover plate and a controller arranged to control a temperature, a pressure, or both, of a heat exchange fluid within the network of channels in order to reduce a temperature deviation of a part of the substrate table from a corresponding target temperature. In an embodiment, the temperature stabilization device comprises a heating element and a controller arranged to control the heat output from the heating element in order to reduce a temperature deviation of a part of the substrate table from a corresponding target temperature. In an embodiment, the heating element comprises a material that undergoes a temperature induced phase transition in the region of a target temperature, the phase transition causing the material to change from a state in which it produces a relatively high heating output below the transition temperature to a state in which it produces a relatively low heating output above the transition temperature. In an embodiment, the substrate table temperature stabilization device is arranged to pass an electric current through the material that undergoes a phase transition, the phase transition being such as to cause the heating element material to change from a state of relatively low resistivity below the transition temperature to a state of relatively high resistivity above the transition temperature. In an embodiment, the substrate table temperature stabilization device is arranged to apply a changing magnetic field to the material that undergoes a phase transition, the phase transition being such as to cause the heating element material to change from a magnetically hysteretic state below the transition temperature to a non-magnetically-hysteretic state above the transition temperature. In an embodiment, the apparatus further comprises a temperature sensor configured to measure the temperature of a portion of the substrate table, the cover plate, or both, and wherein the substrate table temperature stabilization device is configured to reduce a temperature deviation of a part of the substrate table from a corresponding target temperature using a temperature reading from the temperature sensor. In an embodiment, the apparatus further comprises a substrate holder, positioned between the substrate table and the substrate, and arranged to support the substrate. In an embodiment, a thermally conductive coupling medium is arranged to be provided between the substrate table and the cover plate, the substrate holder, or both. In an embodiment, the thermally conductive coupling medium is a fluid, indium, or both. In an embodiment, the substrate holder is formed from a material comprising SiSiC.

In an embodiment, there is provided a device manufacturing method, comprising: projecting a modulated radiation beam, through a liquid, onto a substrate held on a substrate table; and reducing a temperature deviation of a part of the substrate table from a corresponding target temperature by controlling a temperature of a part of a cover plate, the cover plate physically separate from the substrate table, radially outside of the substrate during projection of the modulated radiation beam and having a surface that is substantially adjacent and level with the substrate.

In an embodiment, there is provided a lithographic apparatus, comprising: a substrate table arranged to support a substrate; a projection system configured to project a modulated radiation beam onto a substrate; a liquid supply system configured to provide a liquid in a region between the projection system and a substrate during exposure; a cover plate, physically separate from the substrate table, positioned radially outside of the substrate during exposure, and configured to provide a surface facing the projection system that is substantially adjacent to and level with the substrate; and a thermal insulator arranged to reduce heat transfer between the cover plate and the substrate table in order to provide thermal shielding of the substrate table by the cover plate.

In an embodiment, the thermal insulator comprises low thermal conductance burls on which the cover plate is mounted. In an embodiment, the low conductance burls are arranged to have low thermal conductivity, minimal contact area with the cover plate, minimal contact area with the substrate table, or any combination of the foregoing.

In an embodiment, there is provided a device manufacturing method, comprising: projecting a modulated radiation beam, through a liquid, onto a substrate held on a substrate table; and thermally insulating the a cover plate so as to reduce heat transfer between the cover plate and the substrate table and thereby enable thermal shielding of the substrate table by the cover plate, the cover plate physically separate from the substrate table, radially outside of the substrate during projection of the modulated radiation beam and having a surface that is substantially adjacent and level with the substrate.

In an embodiment, there is provided a lithographic apparatus, comprising: a substrate table arranged to support a substrate; a projection system configured to project a modulated radiation beam onto a substrate; a measuring system configured to determine a position of a portion of the substrate table; a substrate table distortion determining device arranged to provide data regarding a distortion of the substrate table; and a substrate position controller configured to control the position of the substrate relative to the projection system by reference to the position of a portion of the substrate table measured by the measuring system and data regarding a distortion of the substrate table provided by the substrate table distortion determining device.

In an embodiment, the measuring system comprises: a substantially planar reflector mounted on a lateral side of the substrate table; a radiation source configured to direct radiation onto a localized area on the surface of the reflector; and a radiation detector configured to capture radiation reflected back from the localized area of the reflector and determine therefrom a distance between the reflector surface and a reference point, and wherein the substrate table distortion determining device provides data regarding a surface profile of the reflector caused by distortion of the substrate table. In an embodiment, the substrate table distortion determining device is configured to measure a thermally-induced distortion of a part of the substrate table, the reflector, or both. In an embodiment, the substrate table distortion determining device comprises a plurality of pairs of radiation sources and radiation detectors, each configured to determine a distance between a different portion of the reflector surface and a corresponding reference point and thereby derive the data regarding a surface profile of the reflector. In an embodiment, the substrate table distortion determining device is configured to estimate the surface profile of the reflector based on a predictive theoretical model. In an embodiment, the substrate table distortion determining device is configured to estimate the surface profile based on calibration data stored in a calibration data memory.

In an embodiment, there is provided a device manufacturing method, comprising: projecting a modulated radiation beam onto a substrate held by a substrate table; determining a position of a portion of the substrate table; and controlling the position of the substrate relative to a projection system used to project the modulated radiation beam by reference to the determined position of the portion of the substrate table and data regarding a distortion of the substrate table.

In an embodiment, there is provided a method of mapping a surface profile of a substrate table reflector in a lithographic apparatus, comprising: providing a first substantially planar reflector mounted on a first lateral side of a substrate table configured to support a substrate, the first reflector having a normal parallel to a first axis; providing a second substantially planar reflector mounted on a second lateral side of the substrate table, the second reflector having a normal parallel to a second axis non-parallel with respect to the first axis; and moving the substrate table parallel to the first axis while measuring a perpendicular distance from a surface of the second reflector to a reference point in a reference frame.

In an embodiment, the method further comprises moving the substrate table parallel to the second axis while measuring a perpendicular distance from a surface of the first reflector to a reference point in a reference frame.

In an embodiment, there is provided a device manufacturing method, comprising: mapping a surface profile of a reflector of a substrate table by moving the substrate table parallel to a first axis while measuring, in a direction substantially parallel to a second axis, a distance from a surface of the reflector to a reference point, the second axis being substantially orthogonal to the first axis; projecting a modulated radiation beam onto a substrate; and moving the substrate relative to a projection system used to project the modulated radiation beam in order to expose different target regions of the substrate, the movement controlled by reference to a position of the substrate, the position being determined by reference to a measurement of the separation of the substrate table reflector from a reference point and the surface profile of the substrate table reflector.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. An apparatus, comprising:
   a substrate table arranged to hold a substrate during exposure in an immersion lithographic apparatus; and
   a cover plate physically separate from the substrate table, the cover plate positioned on top of a surface of the substrate table during exposure, the cover plate configured to provide a surface, facing a projection system of the immersion lithographic apparatus, that is adjacent to and substantially level with the substrate, wherein the cover plate, a surface of the substrate table under the cover plate, or both, has a reflective surface.

2. The apparatus according to claim 1, further comprising the immersion lithographic apparatus, the immersion lithographic apparatus, comprising:
   the projection system to project a modulated radiation beam onto the substrate, and
   a liquid supply system to provide a liquid in a region between the projection system and the substrate during exposure.

3. The apparatus according to claim 1, wherein the reflective surface is a reflective coating.

4. The apparatus according to claim 1, wherein the cover plate has the reflective surface.

5. The apparatus according to claim 4, wherein the reflective surface of the cover plate faces the substrate table.

6. The apparatus according to claim 1, wherein there is a gap under the cover plate between the cover plate and the substrate table.

7. The apparatus according to claim 6, wherein the gap is between a plurality of protrusions of the cover plate, of the surface of the substrate table, or of both.

8. A device manufacturing method, comprising:
   projecting a modulated radiation beam, through a liquid, onto a substrate held on a substrate table, the substrate table having a cover plate physically separate from the substrate table, the cover plate positioned on top of a surface of the substrate table during exposure, and the cover plate providing a surface that is adjacent to and substantially level with a surface of the substrate onto which the modulated radiation beam is incident; and
   reducing a heat transfer to or from the cover plate using a reflective surface of the cover plate, of a surface of the substrate table under the cover plate, or both.

9. The method according to claim 8, wherein the reflective surface is a reflective coating.

10. The method according to claim 8, wherein the cover plate has the reflective surface.

11. The method according to claim 10, wherein the reflective surface of the cover plate faces the substrate table.

12. The method according to claim 8, wherein there is a gap under the cover plate between the cover plate and the substrate table.

13. The method according to claim 8, wherein the gap is between a plurality of protrusions of the cover plate, of the surface of the substrate table, or of both.

14. An apparatus, comprising:
   a substrate table to hold a substrate;
   a projection system to project a modulated radiation beam onto the substrate;
   a liquid supply system to provide a liquid in a region between the projection system and the substrate table during exposure; and
   a cover plate physically separate and removable from the substrate table, the cover plate positioned on top of a surface of the substrate table during exposure and providing a surface facing the projection system that is substantially level with and adjacent to the substrate when supported by the substrate table;
   a thermal insulator to reduce heat transfer to or from the cover plate,
   wherein the cover plate, a surface of the substrate table under the cover plate, or both, has a reflective surface.

15. The apparatus according to claim 14, wherein the thermal insulator comprises the reflective surface on the cover plate.

16. The apparatus according to claim 15, wherein there is a gap under the cover plate between the cover plate and the substrate table.

17. The apparatus according to claim 14, wherein the thermal insulator comprises a plurality of protrusions.

18. The apparatus according to claim 17, wherein the protrusions are part of the substrate table.

19. The apparatus according to claim 14, further comprising a substrate holder, separate from the substrate table, to support the substrate, the substrate holder positioned between the substrate table and the substrate when supported by the substrate table.

20. The apparatus according to claim 14, further comprising a temperature sensor configured to measure the temperature of at least a portion of the cover plate.

21. The apparatus according to claim 1, further comprising a plurality of protrusions of the substrate table to support the cover plate and a plurality of protrusions under the substrate when supported by the substrate table, a surface of the plurality of protrusions to support the cover plate and of the plurality of protrusions under the substrate forming a substantially flat plane.

22. An apparatus, comprising:
   a substrate table arranged to hold a substrate;
   a projection system to project a modulated radiation beam onto the substrate;
   a liquid supply system to provide a liquid in a region between the projection system and the substrate table;
   a cover plate physically separate and removable from the substrate table, the cover plate positioned outward of the substrate during exposure and the cover plate configured to provide a substantially horizontal surface adjacent to the substrate, wherein the cover plate, a surface of the substrate table under the cover plate, or both, has a reflective surface; and
   a plurality of protrusions of the substrate table to support the cover plate.

23. The apparatus according to claim 22, further comprising a plurality of protrusions under the substrate when supported by the substrate table, a surface of the plurality of protrusions to support the cover plate and of the plurality of protrusions under the substrate forming a substantially flat plane.

24. An apparatus, comprising:
a movable table supporting an object;
a projection system to project a modulated radiation beam onto a substrate;
a liquid supply system to provide a liquid in a region between the projection system and the table;
a cover plate physically separate from the substrate table, the cover plate positioned on top of a surface of the table and outward of the object during exposure, the cover plate configured to provide a substantially horizontal surface at least partly surrounding the object and having a reflective surface; and
a plurality of protrusions of the table to support the cover plate thereon.

25. The apparatus according to claim 24, wherein the object comprises the substrate and the cover plate has an aperture to surround the substrate.

* * * * *

UNITED STATES PATENT AND TRADEMARK OFFICE
CERTIFICATE OF CORRECTION

| | |
|---|---|
| PATENT NO. | : 8,947,631 B2 |
| APPLICATION NO. | : 13/116423 |
| DATED | : February 3, 2015 |
| INVENTOR(S) | : Koen Jacobus Johannes Maria Zaal et al. |

Page 1 of 1

It is certified that error appears in the above-identified patent and that said Letters Patent is hereby corrected as shown below:

Title Page:
On Page 2, Item (56) References Cited - U.S. Patent Documents, Column 2
  after "2004/0259008 A1   12/2004 Endo et al."
  insert --2004/0259040 A1   12/2004 Endo et al.--.

Signed and Sealed this
Nineteenth Day of May, 2015

Michelle K. Lee
*Director of the United States Patent and Trademark Office*